United States Patent [19]

Tanis

[11] 3,959,737

[45] May 25, 1976

[54] FREQUENCY SYNTHESIZER HAVING FRACTIONAL FREQUENCY DIVIDER IN PHASE-LOCKED LOOP

[75] Inventor: William J. Tanis, Wayne, N.J.

[73] Assignee: Engelmann Microwave Co., Montville, N.J.

[22] Filed: Nov. 18, 1974

[21] Appl. No.: 524,533

[52] U.S. Cl. ............................. 331/1 A; 328/42; 331/11; 331/17; 331/25
[51] Int. Cl.² ..................................... H03B 3/04
[58] Field of Search ............... 331/1 A, 11, 17, 18, 331/25

[56] References Cited
UNITED STATES PATENTS

| | | | |
|---|---|---|---|
| 3,286,191 | 11/1966 | Cornwell | 331/11 |
| 3,441,870 | 4/1969 | Wicker | 331/18 X |
| 3,516,007 | 6/1970 | Bos et al. | 331/18 |
| 3,611,175 | 10/1971 | Boelke | 331/11 X |
| 3,684,976 | 8/1972 | Terreault | 331/25 X |
| 3,805,192 | 4/1974 | Ocnaschek et al. | 331/25 X |
| 3,872,397 | 3/1975 | Hanneman | 331/25 X |

*Primary Examiner*—Siegfried H. Grimm
*Attorney, Agent, or Firm*—Carella, Bain, Gilfillan & Rhodes

[57] ABSTRACT

A frequency synthesizer or portion thereof, that includes only one main phase-locked loop. The phase-lock loop includes a digital divider that can effectively divide in fractions, thus, permitting use of a higher reference frequency than normally required for the same degree of frequency resolution in integer divisor synthesizers. This, in turn, increases the short-term stability and reduces phase-noise. The fractional divider includes a secondary phase-lock loop that tends to introduce an unwanted ramp signal which causes spurious sidebands in the output signal. These spurious sidebands, when objectionable, are effectively suppressed by a circuit that generates a second ramp signal of similar frequency, duration and shape to the unwanted ramp signal but of opposite phase.

7 Claims, 9 Drawing Figures

FREQUENCY SYNTHESIZER HAVING FRACTIONAL FREQUENCY DIVIDER IN PHASE-LOCKED LOOP

BACKGROUND OF THE INVENTION

1. Field of the Invention

Broadly speaking, this invention relates to frequency synthesizers. More particularly, in a preferred embodiment, this invention relates to a frequency synthesizer of the indirect synthesis type, or a section thereof, which employs only one main phase-locked loop.

2. Discussion of the Prior Art

Frequency synthesizers fall into two general classes. In the first class, direct frequency synthesis is employed and new frequencies are derived from a single reference frequency by means of combinations of several additions, subtractions, multiplications and divisions of the reference frequency. This method is very complex and such a synthesizer is very expensive requiring a large number of passive and active elements.

The second class of synthesizers employs indirect frequency synthesis wherein new frequencies are derived from a single reference frequency by means of programmable phase-locked loops which contain whole number frequency dividers. If small steps in output frequency are necessary, then several phase-locked loops are employed, the output of one loop being divided and then added to or subtracted from the next. In other words, the output frequency of the synthesizer is divided down to a lower frequency for phase comparison with a reference frequency. A digital divider (with an integer divisor) provides an output frequency resolution which is directly related to the reference frequency. As higher resolution is needed, the reference frequency must be lowered. With a lower reference frequency, the short-term stability decreases and the phase-noise increases.

When short-term stability must be high and phase-noise low, a complex, multiple phase-lock loop system must be employed. Unfortunately, such multiple-loop, prior art synthesizers are expensive and complicated and it is very difficult to control spurious signals which may occur at many different frequencies, both close to and far away from the carrier frequency.

The problem, then, is to provide a frequency synthesizer which does not suffer from the aforementioned defects. This problem has been solved by the instant invention in which the digital divider in the phase-locked loop, is effectively made to divide in fractional steps so that a much higher reference frequency may be employed than that used in prior art systems. This permits the use of only one main phase-locked loop, in the aforementioned synthesizer or section thereof, thus holding generation of spurious signals to a minimum. A secondary phase-locked loop, used for the fractional dividing, does produce some close-to-the-carrier spurious signals, but if unacceptable this is effectively reduced by means of a tunable frequency discriminator, or a sideband reduction ramp generator or a combination of both.

U.S. Pat. No. 3,605,025 which issued on Sept. 14, 1971 to A. J. Lincoln discloses a fractional divider bearing a superficial similarity to the fractional divider disclosed herein. However, the Lincoln divider is very complicated and includes a cascaded array of counting stages, the overflow from a previous counter being used to inhibit conduction of an input pulse to the next stage.

U.S. Pat. No. 3,721,904 which issued on Mar. 20, 1973 to L. A. Verhoeven also teaches a frequency divider with a variable divisor, but the divisor is restricted to whole number integers. See also U.S. Pat. Nos. 3,701,027; 3,464,018; 3,544,906 and 3,691,471 for general background.

SUMMARY OF THE INVENTION

As a solution to these and other problems an illustrative embodiment of the invention comprises a frequency synthesizer including a voltage-tuned oscillator, the output frequency of which is proportioned to a d.c. potential applied to the tuning port thereof. The synthesizer also includes a digital divider connected to the output of the voltage-tuned oscillator, the digital divider dividing the output frequency of the voltage-tuned oscillator by a factor of N, where N is any integer or fractional number greater than unity. The circuit includes means, connected to the digital divider, for altering the value of the factor N and a source of a reference frequency signal. Means, connected to the output of the digital divider and to the source of the reference signal, compare the phase of the reference frequency signal with the phase of the divided output of the voltage-tuned oscillator thereby generating an error signal if there is any phase difference detected.

Finally, the synthesizer includes means for supplying the error signal to the tuning port of the voltage-tuned oscillator whereby the oscillator alters its output frequency, and hence the output frequency of the synthesizer, in an offsetting manner to reduce the error signal towards zero.

The invention and its mode of operation will be more fully understood from the following detailed description, when taken with the drawings, in which:

DETAILED DESCRIPTION OF THE INVENTION

Figure 1:
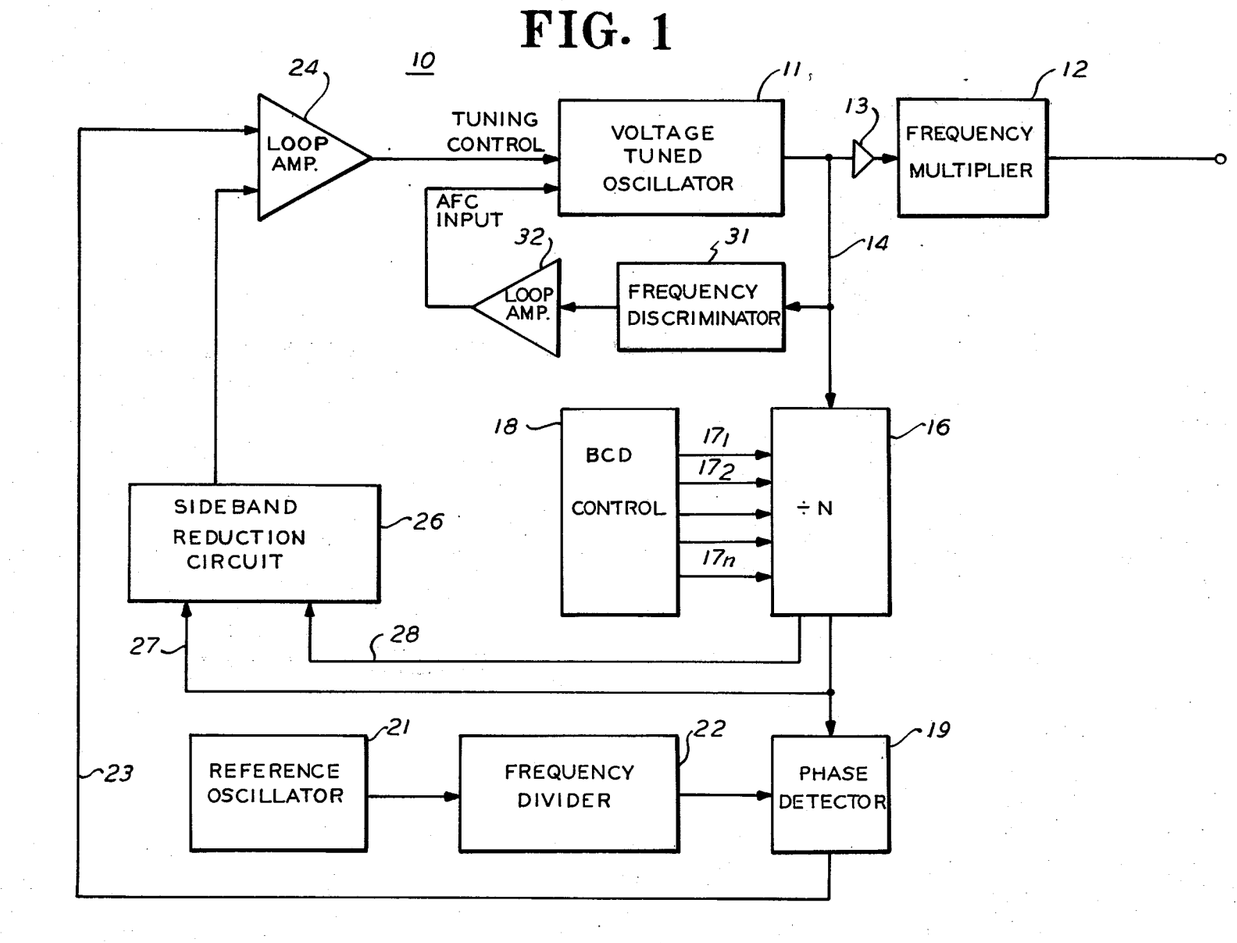
FIG. 1 is a simplified block diagram of an illustrative frequency synthesizer according to the invention.

FIG. 1 is a simplified block diagram of the invention. As shown therein, frequency synthesizer 10 includes a voltage-tuned oscillator 11, the output from which is connected to the input of an amplifier 13. The output of amplifier 13, in turn, is connected to the input of a frequency multiplier 12 and the output of the synthesizer is taken from the output of multiplier 12. In some embodiments of the invention either the frequency multiplier or the amplifier, or both, may be omitted. In this latter event, the output of the synthesizer is taken directly from the output of oscillator 11.

The output of oscillator 11 is also connected, via conductor 14, to the input of a divider stage 16. As will be more fully explained below, the division of stage 16 is determined by the binary-coded decimal signal applied thereto, over conductors 17–17n, from a BCD control stage 18. Unlike conventional divider stages, divider 16 may assume a fractional divisor and is not restricted to whole number integers. The particular value that the divisor assumes is determined by the operator who, for example, manually adjusts selector controls in BCD control stage 18. Alternatively, the divisor may be selected remotely, for example by relays or solid-state logic in BCD control stage 18.

The output of divider 16 is connected to one input of a phase detector 19. A reference oscillator 21 is connected to a second frequency divider 22, the output of which is connected to the second input of phase dector 19. Phase detector 19, thus, compares the phase of the divided output from oscillator 11 with the divided output from reference oscillator 21. If there is a phase difference present, an error signal is generated on conductor 23, which error signal is applied to one input of a loop amplifier 24, thence to the tuning control input of oscillator 11. Thus, phase detector 19, conductor 23 and loop amplifier 24 constitute a feedback loop which provides a correction signal for oscillator 11 if the output frequency thereof drifts from the desired value.

As will be explained below, the operation of divider 16 produces an unwanted, low-frequency ramp signal which is superimposed upon the correction signal on conductor 23. It is this ramp signal that tends to produce spurious sidebands in the R.F. output signal from the synthesizer. To eliminate this problem, the synthesizer 10 further includes a sideband reduction circuit 26 which is connected, via a conductor 27, to the output of divider 16 and also, via a conductor 28, to an intermediate output thereof. The output of sideband reduction circuit 26 is connected to the second input of amplifier 24.

Sideband reduction circuit 26 reduces the effect of the unwanted ramp signal by providing an opposing ramp signal of opposite phase. Depending upon the application of the synthesizer, certain embodiments of the invention may omit the sideband reduction circuit.

A frequency discriminator 31 has its input connected to the output of oscillator 11 or conductor 14 and its output connected to a second loop amplifier 32, thence to the automatic frequency control input of oscillator 11. As will be explained, frequency discriminator 31 reduces still further any residual ramp signal and also acts to lower any phase noise, which is close to the carrier frequency. Depending upon the application of the synthesizer, certain embodiments of the invention may omit the frequency discriminator.

Figure 2:
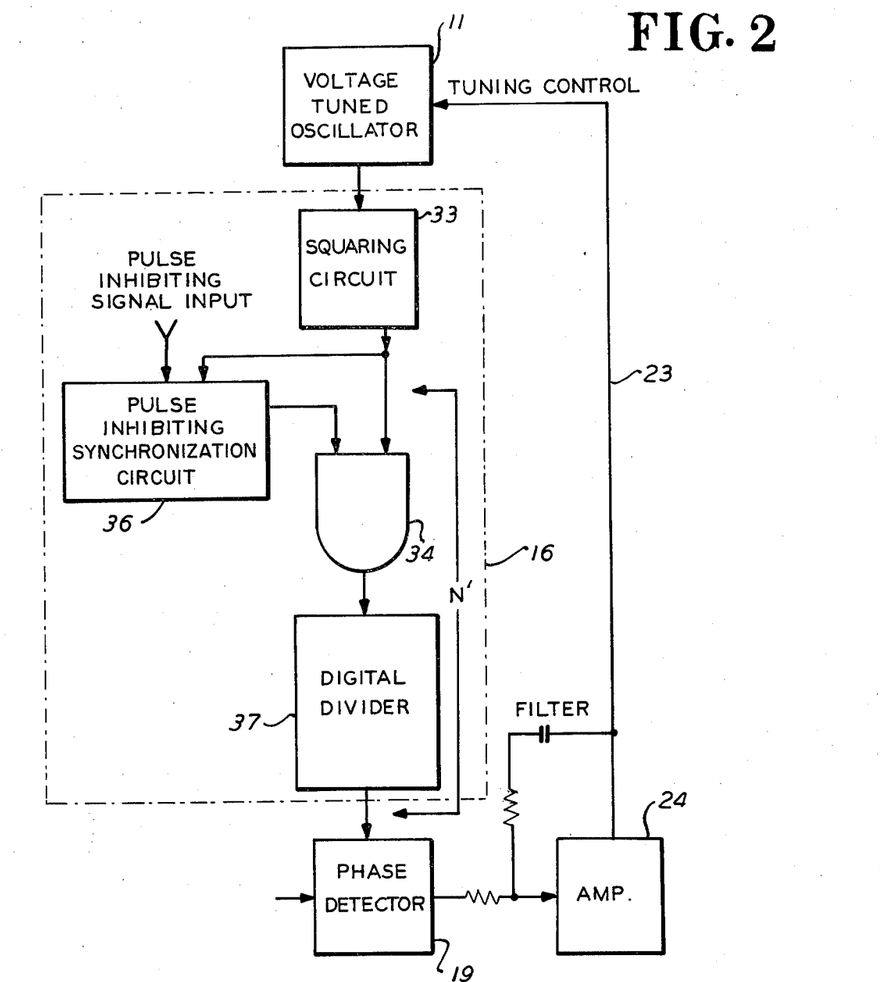
FIG. 2 is a block diagram illustrating the fractional divider of FIG. 1 in greater detail.

Referring now to FIG. 2, the operation of divider 16 will be explained in more detail. As previously discussed, with normal digital dividers the divisor N is always an integer and the output of such a divider comprises a pulse train having a rate that equals the input clock rate divided by N, where N is an integer. In FIG. 2, it will be observed that divider 16 comprises a squaring circuit 33 having its input connected to the output of voltage-tuned oscillator 11. The output of squaring circuit 33 is connected to one input of a gate 34 which may be an AND gate or a NAND gate depending on the particular logic used and also to one input of a pulse inhibiting synchronization circuit 36. The output of pulse inhibiting synchronization circuit 36 is connected to the second input of gate 34, the output of which sends signals (inhibited at times) to the input of a standard, variable-divisor, digital divider 37.

As previously shown in FIG. 1, the output of divider 37 is connected, via phase detector 19, conductor 23 and amplifier 24, to the tuning control input of oscillator 11. Now, in a standard, phase-locked digital loop the divisor N equals the input clock rate $R_c$ divided by the output rate $R_o$.

That is:
$$N = R_c / R_o \qquad (1)$$

However, in the circuit shown in FIG. 2, the input clock pulse train to divider 37 from oscillator 11 is periodically interrupted by the removal, or inhibition, of a clock pulse in gate 34. This inhibition is effected whenever pulse inhibiting synchronization circuit 36 removes the gating signal from the second input to gate 34. Each time that a clock pulse is inhibited, the output pulse train is delayed by one clock pulse period T.

Now, in the fractional divider of FIG. 2 clock pulses are extracted at a rate of $R_e$. Thus, for $R_o$ to remain constant (on the average), the rate of $R_c$ must be increased by $R_e$. Let the new clock rate be $R_c'$, then $$R_c' = R_c + R_e \qquad (2)$$

and equation (1) becomes $$N' = R_c' / R_o \qquad (3)$$

Combining equations (2) and (3) we obtain:

$$N' = \frac{R_c + R_e}{R_o} \qquad (4)$$

Then from (1) and (4) we obtain:

$$N' = N + (R_e / R_o) \qquad (5)$$

Where N' is the new divisor. The term $R_e / R_o$ can be either a fraction or an integer.

Combining equations (3) and (5) and solving for $R_c'$ we obtain:

$$R_c' = N' R_o \qquad (6)$$

$$R_c' = (N + R_e/R_o) R_o \qquad (7)$$

$$R_c' = N R_o + R_e \qquad (8)$$

Thus, from equation 6, the average output pulse train rate $R_o$ will be that of the clock pulse train $R_c'$ divided by N', the new divisor, where $N' = N + (R_e / R_o)$ and $R_e$ is the rate at which clock pulses are inhibited in the circuit. The rate of $R_e$ is defined as $$0 \leq R_e < R_c' \qquad (9)$$

The pulse inhibiting synchronization circuit 36, forms a new pulse signal $R_e'$ at the average signal $R_e$. The new signal $R_e'$ is synchronized with the clock pulse train so that only one whole clock pulse is inhibited for each period of the pulse inhibiting signal $R_e$. In some embodiments of the invention, however, it is possible that more than one whole clock pulse would be inhibited for each period of $R_e$.

In the phase-locked loop of FIG. 2, $R_o$, the average output of divider 37 must equal the rate of the reference frequency and is therefore fixed. From eq. 8 we see that the input clock frequency $R_c'$ must equal $NR_o + R_e$. Therefore, as the rate of the clock pulse inhibiting signal $R_e$ changes, the clock signal rate $R_c'$ must change by the same amount (and thus the output frequency of oscillator 11) in order to keep the average output rate $R_o$ constant for proper phase detection.

As an example, assume that we want the frequency of oscillator 11 increased by 10 Hz from an initial frequency $R_c$. For this to occur the inhibiting signal rate must also be 10 Hz. The rate of the inhibiting signal may be digitally controlled by means of a second phase-locked loop of conventional design (not shown) having a digital divider. The superiority of the instant invention may be seen from the following example. Suppose that 10 Hz frequency steps are desired at the output of a frequency synthesizer. With prior art single loop digital phase-locked loop circuitry, a reference frequency of 10 Hz would be required. But an analysis of such a circuit shows that if N is very large, the loop gain is reduced to such an extent that stability and phase-noise cannot be adequately controlled. However, with the Fractional Divider of the instant invention the reference frequency may be set to a much higher frequency, say 10 KHz, so as to increase the loop gain by 1000. The second phase-locked loop, in providing the pulse inhibition signal, would then provide increments of 10, 100, and 1000 Hz in the output frequency.

Figure 3:
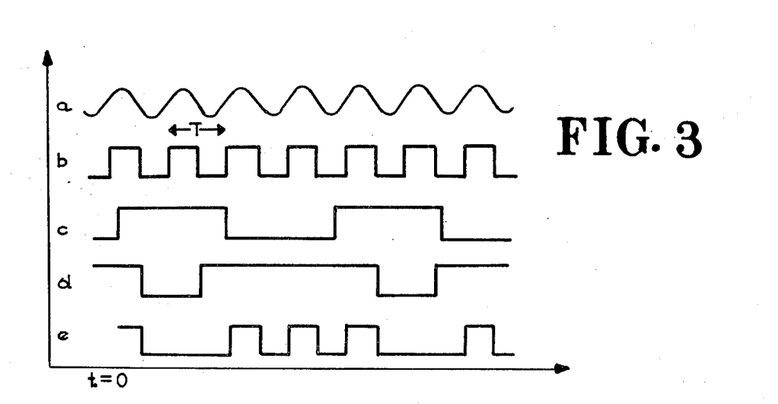
FIG. 3 depicts waveforms which are found at various locations in the circuitry shown in FIG. 2.

FIGS. 3(a)–3(e) depict the waveforms present at various points in the circuit of FIG. 2. FIG. 3(a) represents the clock rate $R_c'$ at the output of oscillator 11. FIG. 3(b) represents the same signal squared at the output of the squaring circuit 33. FIG. 3(c) represents the clock pulse inhibiting signal $R_e$ at the input to the pulse inhibiting synchronizing circuit 36. FIG. 3(d) represents the synchronized output of circuit 36, as applied to the second input of gate 34, and FIG. 3(e) represents the average clock input $R_c$ to divider 37.

When the clock frequency is high it becomes difficult to directly inhibit a single clock pulse and therefore a slightly different technique must be used.

Figure 4:
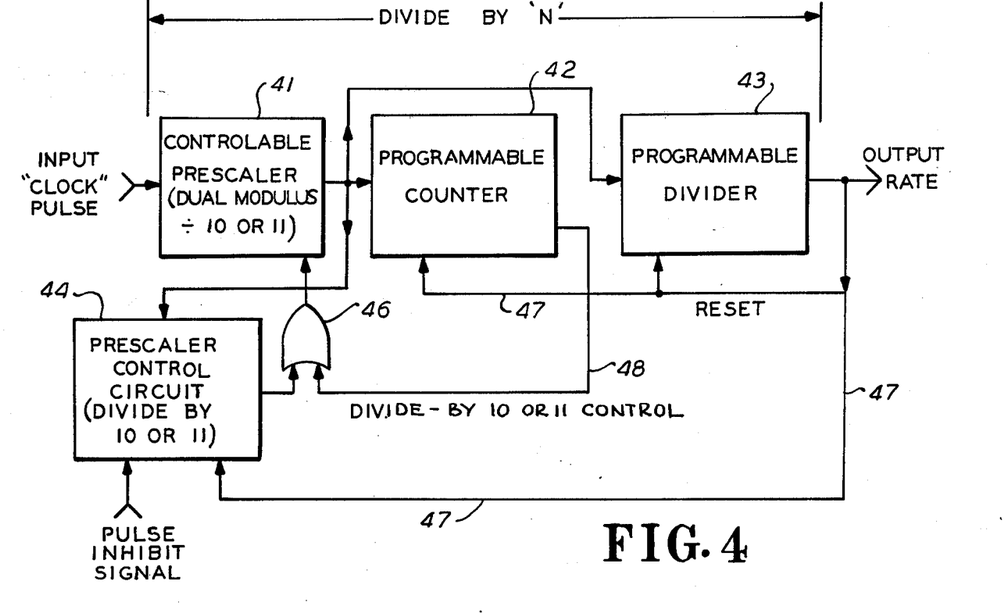
FIG. 4 is a block diagram of an alternate embodiment of the fractional divider shown in FIG. 2.

FIG. 4 depicts an alternate embodiment of the invention wherein a dual-modulus prescaler is utilized to effectively inhibit a single clock pulse upon command. Such dual-modulus prescalers are frequently used in programmable high-speed divider circuits. Connected as is items 41, 42, and 43, the circuit is known in the literature as a "Pulse Swallow" or "Pulse Gobble" circuit.

As shown in FIG. 4, pulse inhibiting synchronization circuit 36, gate 34, and digital divider 37 in FIG. 2 are replaced by prescaler control circuit 44 and by item 41, 42, 43 and 46.

The controllable prescaler 41 receives as its input the clock pulse output of squaring circuit 33 (FIG. 2). The output of prescaler 41 is connected to the input of a programmable counter 42; to the input of a programmable divider 43; and, to the input of a prescaler control circuit 44.

The output of counter 42 is connected to one input of an OR-gate 46, the output of which is connected to the control input of prescaler 41. The output of control circuit 44 forms the other input to OR-gate 46. The output of divider 43 is applied to the input of phase detector 19 (FIG. 2) and also, via a conductor 47, as a reset signal for divider 43, counter 42 and control circuit 44. The pulse inhibit signal is applied to a second input to control circuit 44.

In operation, whenever a clock pulse is to be inhibited controlable prescaler 41 is made to divide by (K + 1) instead of k, i.e. by 11 instead of 10 in the illustrative example. Thus, one extra clock pulse is required at the input of prescaler 41 to generate an input pulse.

The controllable modulus prescaler 41 accepts the change-modulus signal (divide-by K or K+1) several clock pulse periods before the change in modulus takes place and, thus, eliminates the need for the ultra-fast gating circuits shown in FIG. 2. The prescaler control circuit 44 changes the modulus of prescaler 41 at the appropriate time so as not to interfere with the standard high speed divider operation of the item 41, 42, 43 combination. With the aforementioned standard high speed divider conductor 48 would terminate directly in the controllable prescaler 41 controlling its modulus (K or K+1)

Each time that a clock pulse is inhibited in fractional divider 16, the divided output is delayed by the period of the clock pulse. Assume that there are a large number of non-delayed outputs between each delayed output and assume further that the frequency of the oscillator in FIG. 1 is such that the average divided output rate, $R_o$, at the input to phase detector 19 is equal to the reference frequency rate at the output of divider 22.

Figure 5:
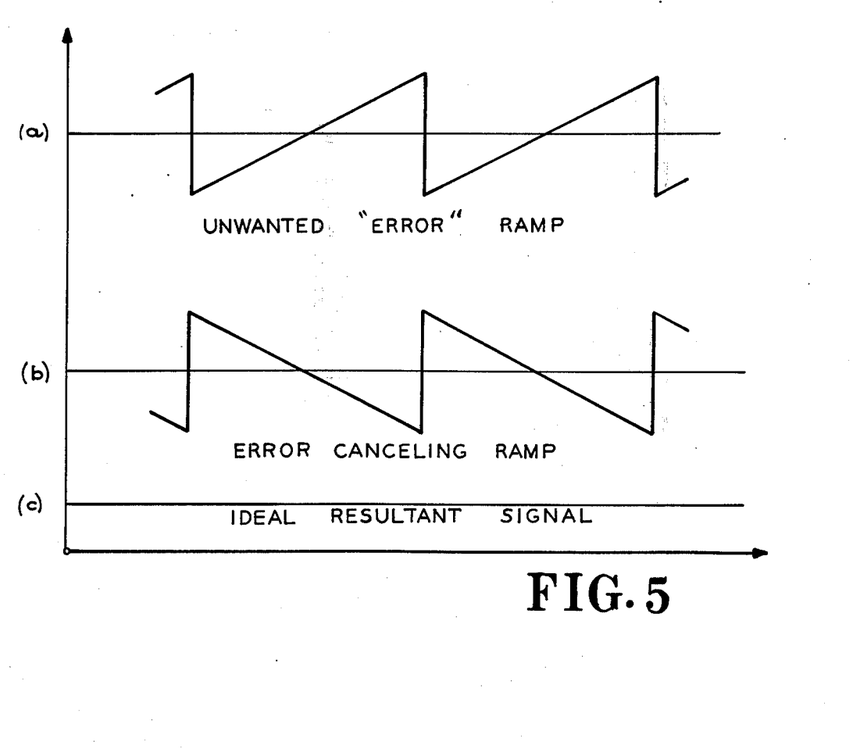
FIG. 5 is a graph showing how an unwanted error ramp signal generated by the circuitry of FIGS. 1 and 2 may be suppressed.

Each delayed fractional divider output causes an instantaneous jump in phase at phase detector 19. The phase-locked, loop-controlled oscillator 11 then tries to correct for this phase shift by increasing its frequency slightly. The frequency of oscillator 11 then slowly decreases until the next delayed fractional divider output signal is obtained. Thus, phase detector 19 gives an unwanted ramp output. The ramp resets to its start point each time that there is a delayed fractional divider output. FIG. 5(a) depicts the unwanted ramp signal.

Under some conditions, for example, high pulse inhibiting rates, almost every fractional divider output pulse is delayed. Under these circumstances an unwanted ramp of opposite phase is produced. With this latter ramp, as the pulse inhibiting signal rate increases, the unwanted ramp rate decreases.

These ramps, if not properly filtered, can cause sidebands on both sides of the synthesizer's output carrier. The sideband reduction circuit 26 (FIG. 1) to be described below, acts as an effective pre-filter to suppress these unwanted ramps.

If a ramp signal having the same frequency, amplitude and shape, but of opposite phase, to the unwanted ramp, is injected at the input to amplifier 24 (FIG. 1) the two will cancel each other out, as shown in FIGS. 5(b) to 5(c). Thus, the sidebands can be effectively reduced before filtering.

Some unwanted ramps are, of course, produced by harmonics but these are at a lower level than those discussed above and although they are more difficult to cancel out, are not as significant.

In order to reduce the amplitude of the unwanted ramps before filtering, sideband reduction circuit 26 must be precisely controlled with respect to frequency, rate, form, and amplitude. The circuitry necessary to accomplish this will be discussed in more detail later.

The sideband reduction technique discussed above is not perfect and at times it is desirable to incorporate a frequency discriminator to further reduce the unwanted sidebands. Also, if the main loop divisor N is considerable, the phase (FM) noise created in the loop is not insignificant. As will be explained discriminator 31 also helps to reduce any close-to-the-carrier phase-noise which may be generated.

Discriminator 31 produces a DC voltage which is proportional to the change in input frequency thereto. This voltage is amplified by amplifier 32 and fed back to the AFC port of oscillator 11. Thus, the phase (FM) noise and spurious sidebands are reduced by the feedband signal generated by discriminator 31.

Instead of discriminating at an intermediate frequency, as will be shown on the detailed block diagram to be discussed below, the discrimination may also occur at the output frequency of the synthesizer, as shown on the simplified block diagram of FIG. 1.

The limitation of this discriminator technique is the noise level of the discriminator itself. Some noise improvement is obtainable if a low-noise, stable but step-tunable microwave source, whose output is referenced to reference oscillator 21, is mixed with the RF output from oscillator 11 and the difference frequency applied to the discriminator. The FM noise at the discriminator input is then much larger than the illustrative embodiment shown because there are no dividers to reduce the sensitivity.

Figure 6:
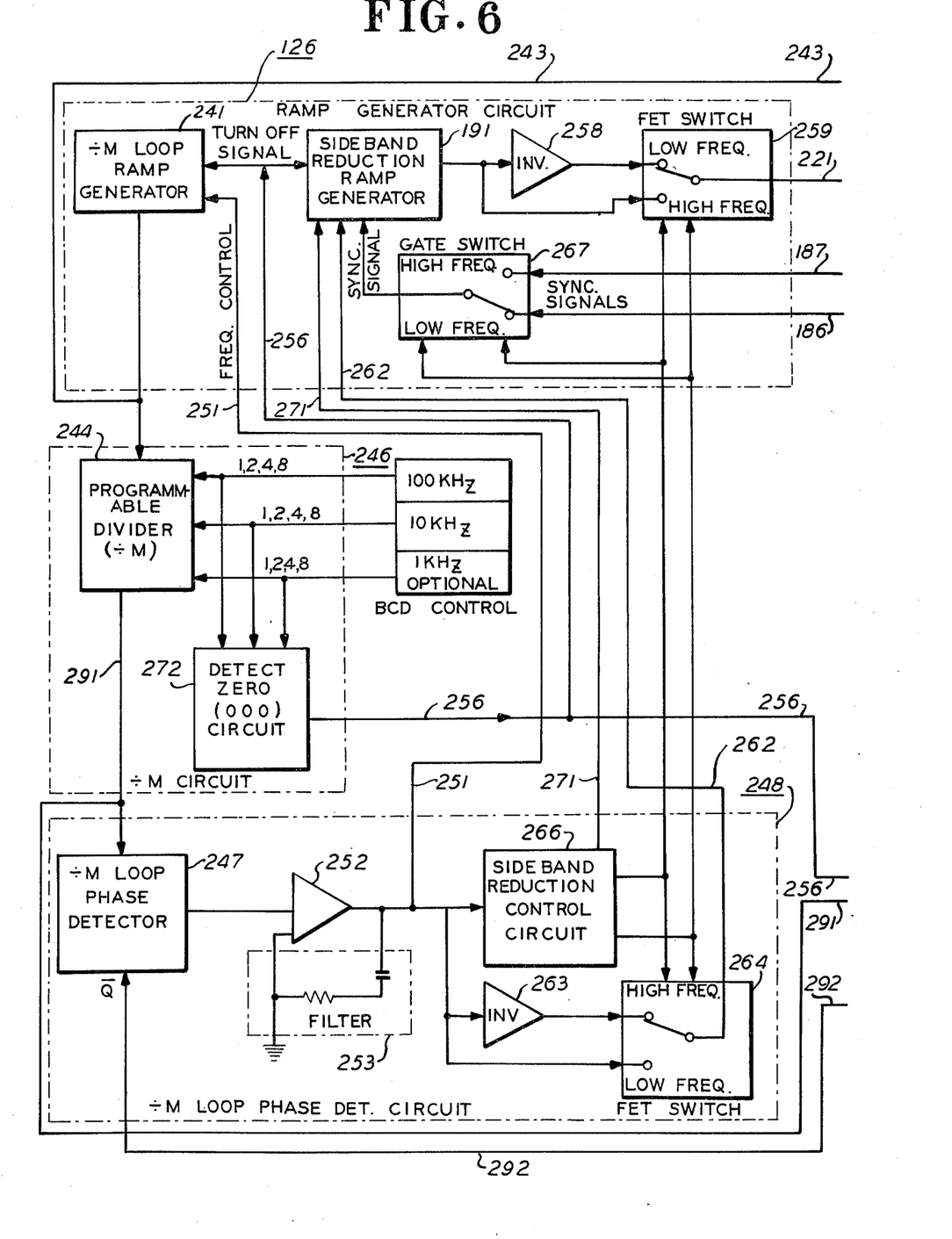
FIGS. 6, 7 and 8 are block diagrams showing the circuitry of the illustrative synthesizer shown in FIGS. 1, 2 and 4 in considerably more detail.
Figure 7:
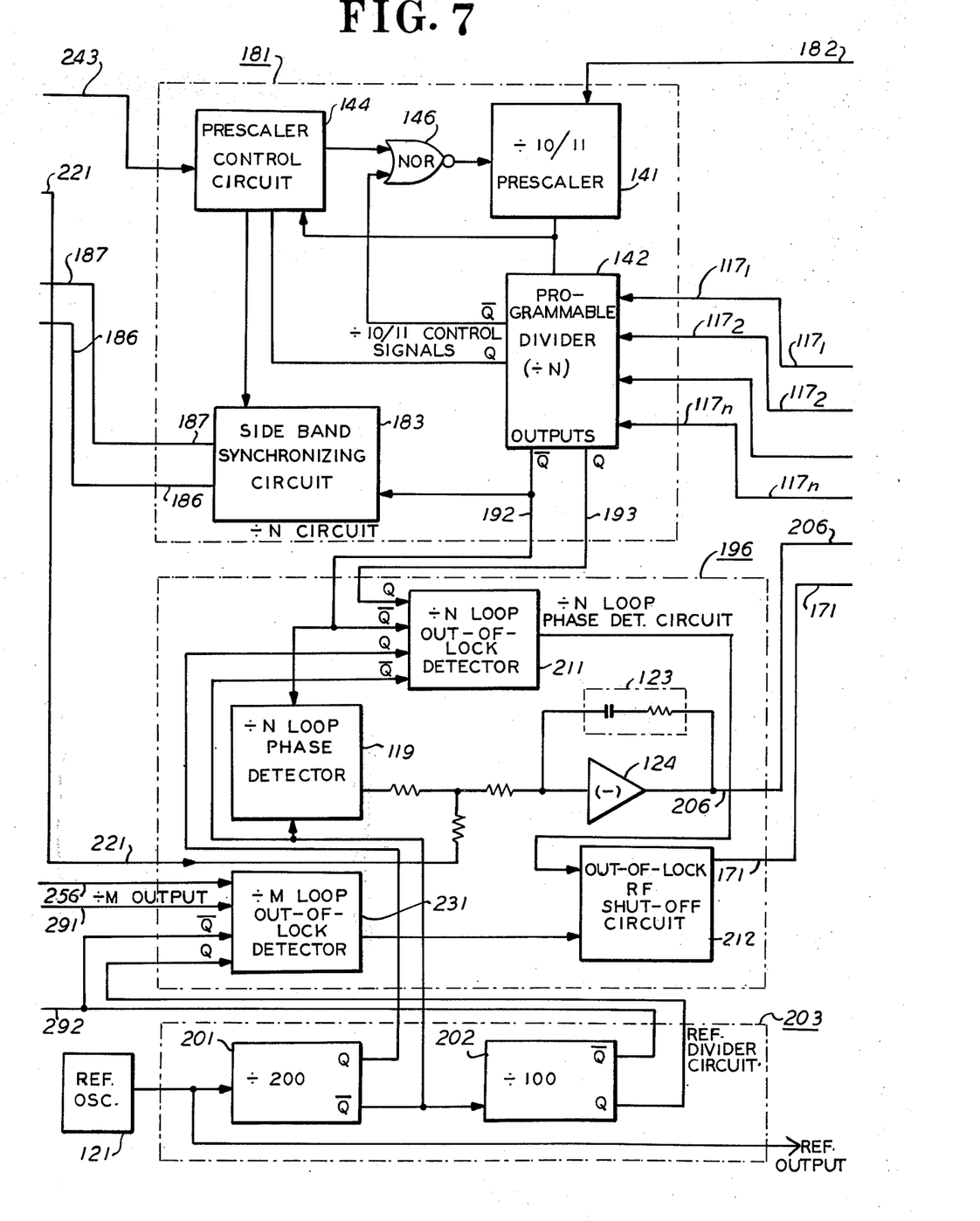
Figures 8, 9:
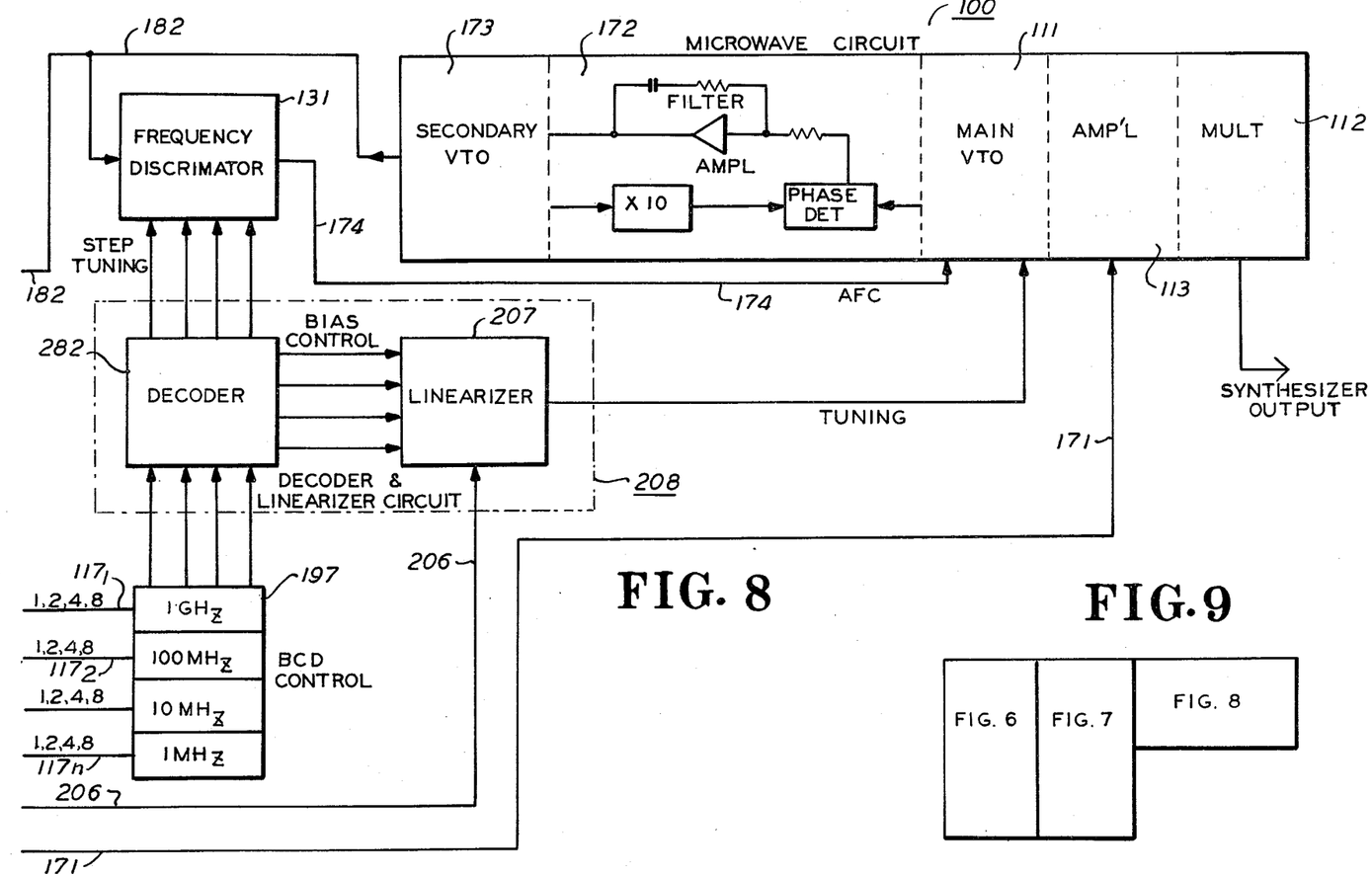
FIG. 9 is a diagram depicting how FIGS. 6, 7 and 8 should be assembled to form a single diagram.

FIGS. 6–8 depict the circuitry of the synthesizer in considerably more detail, and FIG. 9 explains how FIGS. 6, 7 and 8 should be assembled to obtain the overall schematic of the synthesizer.

Referring to FIG. 8, the synthesizer includes a microwave circuit 100 which comprises a main voltage-tuned oscillator 111, an amplifier 113 and a frequency multiplier 112 similar in function to oscillator 11, multiplier 12 and amplifier 13, in FIG. 1. Amplifier 113 is inhibited whenever the phase-locked loop is out-of-lock, as determined by a signal on a conductor 171.

The output of oscillator 111 is divided by 10 by means of an internal phase-locked loop circuit 172. A secondary voltage controlled oscillator 173 is controlled by loop 172 and produces an output at one tenth of the main variable frequency oscillator output. The phase noise of the main VTO and spurious sidebands thereof are controlled by the discriminator loop signal on conductor 174 at the AFC input port of main oscillator 111. This loop signal is generated by a frequency discriminator 131 similar to discriminator 31 in FIG. 1.

FIG. 7 includes a ÷ N circuit 181 which includes a ÷ 10 or ÷ 11 prescaler 141, a programmable divider 142, a prescaler control circuit 144 and a NOR-gate 146 similar in function to comparable elements priorly discussed in connection with FIG. 4. (Divider 142 includes both items 42 and 43)

The Main VTO signal, divided by 10, is applied via a conductor 182 to the divide-by-10 or 11 prescaler 141. Prescaler 141, prescaler control circuit 144, and the programmable divider 142 were described in more detail above and will not be further discussed here.

A sideband reduction synchronizing circuit 183 connected to control circuit 144 and divider 142 detects when the fractional divider output pulse is delayed during low pulse inhibiting rates and when it is not delayed during high pulse inhibiting rates. The output of synchronizing circuit 183 on conductors 186 and 187 is then used to synchronize sideband reduction ramp generator 191 in sideband reduction circuit 126 (FIG. 6). The output of programmable divider 142 on conductor 192 is phase-compared in a phase detector 119 of a Divide-by-N loop phase detector circuit 196. Programmable divider 142 is controlled by BCD digital signals generated, for example, by thumb-wheel switches 197 or from BCD signals external to the synthesizer.

The divided-down RF output from Divide-by-N circuit 181 is fed to phase detector 119 and phase-compared with a reference frequency obtained by dividing down the output of a reference oscillator 121 in fixed dividing stage 201 in a divider circuit 203. The output of phase detector 119 is a train of pulses whose width and polarity are a function of the phase difference between the two signals. The pulse train from detector 119 is then filtered in a filter 123 and amplified in a loop amplifier 124. This phase error signal is then fed, via a conductor 206, back to the Main VTO 111 of microwave circuit 100 for phase correction of the RF signal. Due to nonlinearities in the tuning curve of Main VTO 111, the error signal is first passed through a linearizer 207 in a decoder and linearizer circuit 208.

Since it is important to have the synthesizer RF output turned off when the phase-locked loops are unlocked, out-of-lock detectors and turn-off circuits are provided. A Divide-by-N loop out-of-lock detector 211 monitors the pulse trains of the reference signal from divider circuit 203 and of the variable signal on conductors 192 and 193 from ÷ N circuit 181. If two pulses of one signal appear within one period of the other signal an output pulse is generated by out-of-lock detector 211. This signal is passed on to RF shut-off circuit 212 which in turn removes the power from RF Amplifier 113 in microwave circuit 100 via the signal on conductor 171.

A Divide-by-M loop out-of-lock detector 231 is also located in detector circuit 196 and operates in a similar fashion to that just described. The output of detector 231 also ties into RF shut-off circuit 212.

It should be noted that if the local phase-locked loop 172 in microwave circuit 100 fails the Divide-by-N loop will fail and the loss of lock will be detected by the Divide-by-N loop out-of-lock detector 211.

As previously discussed, the unwanted ramp signal present at the output of phase detector 119 is canceled out by means of the sideband reduction signal applied over a conductor 221 from Ramp Generator 191 in Ramp Generator Circuit 126 (FIG. 6).

The reference signal obtained from reference oscillator 121 illustratively a 5 MHz signal, is used for phase comparison to keep the synthesizer on frequency. Reference oscillator 121 is advantageously a highly stable, crystal controlled oscillator contained in a proportional oven and may have stabilities as great as 1 part in $10^9$ per day. Frequencies around 5 MHz are usually selected as the reference frequency for performance and economic considerations. If greater stability, or synchronization with other synthesizers, is desired an external reference may be used.

Due to the need for fine output frequency steps, the reference frequency, illustratively 5MHz, must be divided down to a suitable frequency. The frequency resolution at the output of the Divide-by-N loop is given by:

$$\Delta f_n = F \phi_N P \qquad (10)$$

where:

$\Delta f_n$ is the RF output frequency resolution, $F \phi_N$ is the frequency at the Divide-by-N loop phase detector 119, and P is the fixed divisor of prescalling phase-locked loop 172 and multiplier 112.

In the illustrative embodiment shown, $F\phi_N$ is 25 KHz and therefore the reference oscillator frequency is divided in divider 201 by 200 to obtain 25 KHz.

The fine resolution steps are produced by Divide-by-M circuit 246. The output frequency resolution contributed by the Divide-by-M loop is given by:

$$\Delta f_M = F\phi_M P \qquad (11)$$

where:

$\Delta f_M$ is the RF output frequency resolution, $F\phi_M$ is the frequency at the Divide-by-M loop phase detector 247 and P is the fixed prescaler divisor. In the illustrative synthesizer shown, $F\phi_M$ is 250 Hz and, therefore, 5MHz must be divided by a factor of $2 \times 10^4$. Synchronous dividers are advantageously used to keep phase jitter to a minimum.

Turning now to FIG. 6, the Ramp Generator Circuit 126 contains two similar ramp generator oscillators one of which, a Divide-by-M loop ramp generator 241 provides a pulse train output which comprises the pulse inhibiting signal to controller 44 of FIG. 4. This inhibit signal is applied via a conductor 243 to ÷N circuit 181. The pulse train also is passed to a programmable divider 244 in a Divide-by-M circuit 246 for division by M to be compared in a Divide-by-M loop phase detector 247 in a ÷M loop phase detector circuit 248.

The Divide-by-M loop ramp generator 241 is phase controlled by a signal on a conductor 251 from a loop amplifier 252 and a filter 253 on the Divide-by-M phase detector circuit 248.

When the programmed input to Divide-by-M circuit 246 is 0, 0, 0 the loop is inoperative and ramp generators 191 and 241 are turned off by a signal on conductor 256 from the Divide-by-M circuit 246.

The frequency of sideband reduction ramp generator 191 tracks the unwanted ramp signal at the output of the Divide-by-N loop phase detector 119. After processing, the output of generator 191 is used to null-out the unwanted ramp signal at phase detector 119. The output of generator 191 is either used directly for high frequency ramps or inverted in an inverter 258 for low frequency ramps, as determined by an FET switch 259.

The frequency of sideband reduction ramp generator 191 is controlled by a voltage derived from the Divide-by-M loop ramp generator frequency control voltage at the output of amplifier 252.

For low ramp rates the control voltage, which is applied via a conductor 262, is used as it is, and for high ramp rates the voltage is inverted in an inverter 263 so that the sideband reduction ramp generator frequency will decrease with respect to the Divide-by-M loop ramp frequency and thus track the unwanted ramp voltage. As mentioned previously, for high pulse inhibiting signal rates, the phase of the unwanted ramp voltage changes by 180° and the rate decreases as the pulse inhibiting signal rate increases.

Selection of the appropriate phase is made by means of a second FET switch 264. FET switch 264, FET switch 259 and gate switch 267 are controlled by the output circuit 266 in ÷M loop detector circuit 248.

The sideband reduction ramp generator 191 is set slightly slower than the frequency necessary by means of the frequency control signal conductor 262 and the generator is then synchronized exactly to the unwanted ramp frequency by means of signals from sideband synchronization circuit 183 of the Divide-by-N circuit 181 (FIG. 7). A gate type switch 267 selects whether the high or low frequency synchronization signal will be used. The switching times and durations for sideband reduction ramp generator 191 are all controlled by the sideband reduction control circuit 266 of the Divide-by-M phase detector circuit 248.

At mid-frequencies of the output from Divide-by-M ramp generator 241, the unwanted ramp voltage frequency is high enough that the Divide-by-N loop filter 123 can effectively pitter it. Also, since the phase of the unwanted ramp voltage is changing here, it is difficult to produce a tracking ramp. Therefore, the sideband reduction ramp generator 191 is turned off at these mid-frequencies, via a signal on a conductor 271 from control circuit 266 in ÷M loop detector circuit 248.

The pulse train from Divide-by-M ramp generator 241 is divided by the whole number divisor M in divider 244 and fed to the Divide-by-M loop phase detector 247. The programmable divider 244 is programmed either by thumbwheel switches or by external BCD Controls, in the same manner that programmable divider 142 in ÷N circuit 181 is programmed.

A detect zero circuit 272 detects the case where all zeros are programmed into divider 244. The output of detect zero circuit 272 on conductor 256 prevents an improper output from the Divide-by-M loop out-of-lock detector 273 in Divide-by-N phase detector circuit 196 when the Divide-by-M loop is turned off under all zero conditions. The output of the detect zero circuit 256 also turns off both ramp generators on the ramp generator circuit 126, as previously discussed.

The output of programmable divider 244 is phase compared in phase detector 247 with the 250 Hz reference signal from divider 202 on the reference divider circuit 203 (FIG. 7). The output of the phase detector is a train of pulses whose width and polarity (+ or −) are a function of the phase difference between the two signals. The pulse train is then filtered in filter 253 and amplified in the loop amplifier 252. The phase error signal is then fed back via conductor 251 to the Divide-by-M loop ramp generator 241.

The sideband reduction control circuit 266 controls the activities of the sideband reduction ramp generator 191 as previously discussed. It also controls FET switch 264 which controls the phase of the frequency control voltage for sideband reduction ramp generator 191. Sideband reduction control circuit 266 contains voltage comparators working off loop amplifier 252 output voltage.

Frequency discriminator 131 (FIG. 8) detects "audio" FM noise, amplifies it, and feeds it back negatively via conductor 174 to the Main VTO 111 of the microwave circuit 100 for FM (phase noise) noise reduction. It also in the same manner reduces spurious FM sideband signals produced by the residual, unwanted ramp voltage from the Divide-by-N loop phase detector 119 in ÷N loop detector circuit 196 (FIG. 7).

The discriminator 131 which is mainly conventional and is not shown in detail contains a saturating RF Amplifier driving two varactor tuned high-Q RF Amplifiers. The output of one tuned Amplifier drives a positive output detector and the other a negative output detector. One Amplifier is tuned about 1 MHz lower than the other. The output of the two detectors are connected together to produce a S Curve.

The tuned Amplifiers are frequency controlled by means of varactors. Being Amplified in a DC Amplifier, the S Curve signal is negatively fed back to the varactors to keep the Discriminator operating at the center of its S Curve. The S Curve output signal, after audio amplification is also fed to the AFC port of the Main VTO 111 via conductor 174.

Reed relays step-tune the tuned amplifiers in five increments so as to reduce the control necessary by the relatively low Q tuning varactors (The higher the circuit Q one can maintain, the less will be the noise generated by the frequency discriminator). The relays are controlled by the second most significant BCD control line from BCD control 197 by means of a decoder circuit 282 of the decoder and linearizer circuit 208.

The saturating amplifier mentioned above reduces the effect of AM noise on the discriminator output.

As mentioned above, decoder 282 converts the BCD frequency programming signal from BCD control 197 into four outputs suitable for controlling the reed relays of discriminator 131.

As previously discussed, in order to compensate for VTO nonlinearities, linearizer 207 shapes the tuning voltage which drives the Main VTO 111 so that the Divide-by-N loop will have nearly constant gain over the tuning voltage range. The output from decoder 282 drives a constant current type circuit which reduces the voltage excursion which would otherwise be necessary in the shaping circuit.

One skilled in the art may make various changes and modifications to the illustrative frequency synthesizer shown without departing from the spirit and scope of the invention.

What is claimed is:

1. A frequency synthesizer, which comprises:
   a voltage-tuned oscillator, the output frequency of which is monotonically related to a d.c. potential applied to the tuning port thereof;
   a digital divider connected to the output of said voltage-tuned oscillator, said digital divider dividing the output frequency of said voltage-tuned oscillator by a factor of N, where N is any integer or fractional number greater than unity;
   means connected to said digital divider, for altering the value of said factor N;
   a source of a reference frequency signal;
   means connected to the output of said digital divider and to said source of a reference signal, for comparing the phase of said reference frequency signal with the phase of the divided output of said voltage-tuned oscillator, thereby to generate an error signal if there is any difference in phase; and
   means for supplying said error signal to the tuning port of said voltage-tuned oscillator whereby said oscillator alters its output frequency, and hence the output frequency of the synthesizer, in an offsetting manner to reduce said error signal towards zero;
   wherein said digital divider produces an unwanted ramp signal which tends to produce spurious sidebands in the output of said voltage-tuned oscillator, and said synthesizer further comprises a sideband reduction circuit having an input connected to the output of said digital divider and an output connected to said supplying means, said sideband reduction circuit generating a ramp signal of similar frequency, amplitude and shape to said unwanted ramp signal, but of opposite phase, whereby said unwanted ramp signal is canceled in said supplying means.

2. A frequency synthesizer, which comprises:
   a voltage-tuned oscillator, the output frequency of which is monotonically related to a d.c. potential applied to the tuning port thereof;
   a digital divider connected to the output of said voltage-tuned oscillator, said digital divider dividing the output frequency of said voltage-tuned oscillator by a factor of N, where N is any integer or fractional number greater than unity;
   means connected to said digital divider, for altering the value of said factor N;
   a source of a reference frequency signal;
   means connected to the output of said digital divider and to said source of a reference signal, for comparing the phase of said reference frequency signal with the phase of the divided output of said voltage-tuned oscillator, thereby to generate an error signal if there is any difference in phase; and
   means for supplying said error signal to the tuning port of said voltage-tuned oscillator whereby said oscillator alters its output frequency, and hence the output frequency of the synthesizer, in an offsetting manner to reduce said error signal towards zero;
   wherein said voltage-tuned oscillator includes an automatic frequency control port and said synthesizer further comprises tunable frequency discriminator means having an input connected to the output of said voltage-tuned oscillator and an output connected to said automatic frequency control port for reducing close-to-the-carrier spurious signals and phase noise present in the output of said synthesizer.

3. The synthesizer according to claim 2 further including a frequency divider connected between said voltage-tuned oscillator and said tunable frequency discriminator.

4. A frequency synthesizer, which comprises:
   a voltage-tuned oscillator, the output frequency of which is monotonically related to a d.c. potential applied to the tuning port thereof;
   a digital divider connected to the output of said voltage-tuned oscillator, said digital divider dividing the output frequency of said voltage-tuned oscillator by a factor of N, where N is any integer or fractional number greater than unity;
   means connected to said digital divider, for altering the value of said factor N;
   a source of a reference frequency signal;
   means connected to the output of said digital divider and to said source of said reference signal, for comparing the phase of said reference frequency signal with the phase of the divided output of said voltage-tuned oscillator, thereby to generate an error signal if there is any difference in phase;
   means for supplying said error signal to the tuning port of said voltage-tuned oscillator whereby said oscillator alters its output frequency, and hence the output frequency of the synthesizer, in an offsetting manner to reduce said error signal towards zero;
   a second voltage-tuned oscillator, the output frequency of which is monotonically related to a d.c. potential applied to the tuning port thereof;
   a second digital divider connected to the output of said second voltage-tuned oscillator, said second digital divider dividing the output frequency of said second voltage-tuned oscillator by a factor of M, where M is any real integer;
   means connected to said second digital divider, for altering the value of said factor M;

a source of a second reference frequency signal;

means connected to the output of said second digital divider and to said source of said second reference frequency signal, for comparing the phase of said second reference frequency signal with the phase of the divided output of said second voltage-tuned oscillator, thereby to generate a second error signal if there is any difference in phase;

means for supplying said second error signal to the tuning port of said second voltage-tuned oscillator whereby said second oscillator alters its output frequency in an offsetting manner to reduce said second error signal towards zero; and suppression means, connected to the output of the second voltage-tuned oscillator and responsive to the output signal thereof, interposed between the output of said voltage-tuned oscillator and said digital divider, for suppressing selected input pulses to said digital divider thereby to retard the output wave from said digital divider.

5. A frequency synthesizer, which comprises:

a. voltage-tuned oscillator means, having a tuning input and an output, for producing at the voltage-tuned oscillator output a voltage-tuned oscillator signal of frequency monotonically related to a dc voltage applied to the voltage-tuned oscillator tuning input;

b. dual-modulus prescaler means, having an input connected to the voltage-tuned oscillator output, a control input, and an output, the dual-modulus prescaler means for producing at the dual-modulus prescaler output a dual-modulus prescaler output signal of frequency equal to the frequency of the VTO signal divided by an integer divisor K or (K + 1) depending upon the presence or absence of a control voltage applied to the dual-modulus prescaler control input;

c. a programmable counter, having an input connected to the dual-modulus prescaler output, and an output;

d. programmable divider means, having an input connected to the dual-modulus prescaler output, and an output, the programmable divider means for producing, at the programmable divider output, a programmable divider output signal;

e. prescaler control means, having a first input to which is applied a pulse inhibit signal, a second input connected to the dual-modulus prescaler output, a third input connected to the programmable divider output, and an output, the prescaler control means for selectively altering the divisor of the dual-modulus prescaler means to retard the output of the programmable divider;

f. an OR-gate, having a first input connected to the output of the prescaler control means, a second input connected to the programmable counter output, and an output connected to the control input of the dual-modulus prescaler means;

g. phase comparator means, having a first input to which is applied a reference frequency signal, a second input to the programmable divider output, and an output, the phase comparator means for comparing the phase of the programmable divider output signal to the phase of the reference frequency signal, thereby to produce a phase error signal at the phase comparator output; and h. loop amplifier means, having an input connected to the phase comparator output, and an output connected to the voltage-tuned oscillator tuning input, the loop amplifier means for producing at the loop amplifier output the dc voltage responsive to the phase error signal and tending to adjust the frequency of the voltage-tuned oscillator signal so as to bring the programmable divider output signal into phase lock with the reference frequency signal, and thereby to minimize the phase error signal.

6. The synthesizer according to claim 5 further comprising:

an amplifier connected to the output of said voltage-tuned oscillator; and a frequency multiplier connected to the output of said amplifier.

7. The synthesizer according to claim 5 further comprising:

a frequency translating circuit between said voltage-tuned oscillator and said digital divider.

* * * * *